United States Patent
Tang et al.

(10) Patent No.: US 7,042,398 B2
(45) Date of Patent: May 9, 2006

(54) APPARATUS OF ANTENNA WITH HEAT SLUG AND ITS FABRICATING PROCESS

(75) Inventors: Chia-Lun Tang, Miaoli Hsien (TW); Shih-Huang Yeh, Douliou (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 10/959,251

(22) Filed: Oct. 5, 2004

(65) Prior Publication Data

US 2005/0285794 A1    Dec. 29, 2005

(30) Foreign Application Priority Data

Jun. 23, 2004    (TW) ................................ 93118061 A

(51) Int. Cl.
  *H01Q 1/38*    (2006.01)
(52) U.S. Cl. ................ 343/700 MS; 343/841; 257/659; 257/704
(58) Field of Classification Search ......... 343/700 MS, 343/841; 257/659, 704
See application file for complete search history.

(56) References Cited

U.S. PATENT DOCUMENTS

| | | | |
|---|---|---|---|
| 5,446,314 A * | 8/1995 | Melnick et al. | 257/678 |
| 6,282,095 B1 * | 8/2001 | Houghton et al. | 361/704 |
| 6,686,649 B1 | 2/2004 | Mathews et al. | 257/659 |
| 6,873,032 B1 * | 3/2005 | McCann et al. | 257/673 |
| 6,953,988 B1 * | 10/2005 | Seo et al. | 257/666 |
| 6,965,159 B1 * | 11/2005 | Miks et al. | 257/676 |
| 6,967,395 B1 * | 11/2005 | Glenn et al. | 257/676 |
| 2004/0032371 A1 | 2/2004 | Mendolia et al. | 343/702 |

FOREIGN PATENT DOCUMENTS

EP    1 126 522    8/2001

* cited by examiner

*Primary Examiner*—Tho Phan

(57) ABSTRACT

An apparatus of antenna with heat slug and its fabricating process are provided, in which the antenna with heat slug can be realized with a single sheet or double sheets of metal. Each single sheet of metal can be achieved by simply cutting and bending a metal plate. Thereby, it is a simple and low-cost fabricating process. In the known fabricating process of integrated circuit, the heat slug and the antenna can be combined in a module at the same step. Therefore, integrating the antenna with heat slug in a fabricating process needs not to develop a new process.

24 Claims, 15 Drawing Sheets

APPARATUS OF ANTENNA WITH HEAT SLUG AND ITS FABRICATING PROCESS

FIELD OF THE INVENTION

The present invention generally relates to an antenna and heat slug, and a method of forming the same, and more specifically to an apparatus and fabricating process of an antenna with heat slug to be used in a multi-chip module (MCM) package.

BACKGROUND OF THE INVENTION

The rapid development of integration modules has gained the increasing attention in a multi-chip-module package. Because a multi-chip-module includes multiple chips, the energy consumption is usually high in a single package, which leads to the need of integrating a heat slug in the package for heat dissipation to avoid the over-heating problem caused by the high energy consumption. Currently, the RF front-end module (RF FEM) has successfully integrated the balance/unbalance (balun) transformer, the power amplifier, the duplexer, the switch, the band-pass filter and the low noise amplifier (LNA) into a single package. Although the RF FEM is highly integrated, the antenna, being the front-most element, is still placed in a different module. As the demands of the integration increases, it is inevitable to integrate the antenna into the same RF FEM to achieve an even higher integration.

FIGS. 1A–1D show a packaging process with a heat slug. FIG. 1A is a side view of a multi-chip-module after the steps of die attach and wire bond. Dies 120 are attached and bonded on a substrate 120 via the gold wire 122. FIG. 1B is a side view of a multi-chipmodule after the steps of heat slug attach and compound molding. After attaching a heat slug 114 on the substrate 130, the packaged module is filled with the epoxy 160 via a dispenser. The heat slug 114 usually has a round shape and a plurality of support elements 115, as shown in FIG. 1C. The heat slug 114 is usually made by cutting or molding a metal sheet. After folding the metal sheet along the bend line 116 into a π-like shape, the heat slug 114 is placed on the substrate 130 to form a multi-chip-module. FIG. 1D is a side view of the multi-chip-module after a plurality of metal solder balls 150 are placed into the multi-chip-module.

U.S. Pat. No. 6,686,649 disclosed an antenna and a shield fabricated respectively on both sides of a dielectric cap, and the aforementioned structure is placed on top of the chip in the packaging process to achieve the high integration. However, the design is complicated and the fabrication cost is high. In addition, the placement of the dielectric cap is not suitable for the current IC packaging methods.

U.S. patent publication 2004/0,032,371 disclosed an apparatus of antenna with an electromagnetic shield used in the mobile products. The metal antenna and electromagnetic shield are formed respectively on the top and the bottom sides of a dielectric body. The dielectric body can be fixed on a printed circuit board (PCB). This method incurs a higher fabrication cost for the dielectric body. In addition, the antenna and the electromagnetic shield require the deposit and plate steps in the fabricating process as well as the addition of a metal pattern, both increase the fabrication cost.

European Patent 1,126,522 disclosed an antenna and a plurality of ground surfaces in a multi-layered structure formed respectively on both sides of a dielectric body. The elements in this structure are vertically connected. For example, the antenna feed and ground lines are performed using via holes. In other words, the drilling and the metal filling steps must be included in the fabricating process. As this packaging method is a non-standard IC packaging process, the cost is high.

Because of the aforementioned problems, it is imperative to provide an antenna having a simple structure and a low fabrication cost that can be integrated into a packaging to reduce the overall cost.

SUMMARY OF THE INVENTION

The present invention has been made to overcome the aforementioned drawback of conventional antenna fabricating process. The primary object of the present invention is to provide an apparatus and a cost-effective fabricating process of antenna with heat slug.

Another object of the present invention is to provide an apparatus and a fabricating process of antenna with heat slug that can be integrated into a package without incurring additional packaging steps or processes.

Yet another object of the present invention is to provide an apparatus and a fabricating process of an antenna with heat slug, in which the antenna is simple in structure, easy to fabricate and low in cost.

The final object of the present invention is to provide an apparatus and a fabricating process of an antenna with heat slug, in which the structure of the antenna with heat slug is either single metal sheet or double metal sheets.

To achieve the aforementioned objects, the present invention of an apparatus of an antenna with heat slug includes a substrate, an antenna signal transmission line, at least a chip and at least a metal belt, at least a metal sheet, and a mold compound. The substrate has an upper surface and a lower surface. The lower surface includes a plurality of solder balls for electrical connection to an external circuit. The antenna signal transmission line and the metal belt are formed on the upper surface of the substrate. The chips are placed on the upper surface of the substrate and electrically connected to the antenna signal transmission line. The metal sheet has the function of an antenna and the heat slug, and is placed on the upper surface of the substrate. The mold compound at least covers the chips, the antenna signal transmission line and the metal belt.

According to the present invention, the structure of having at least a metal sheet can be either a single metal sheet or double metal sheets. The structure with single metal sheet can be performed by cutting a metal sheet or molding to a specific shape and then bending the metal sheet. The structure with single metal sheet can further be divided into two types. The first type includes a heat slug having an antenna and a plurality of support elements. The heat slug having an antenna is placed above and kept a distance from the chips. One of the support elements is an antenna feed metal sheet electrically connected to the antenna signal transmission line. The remaining support elements electrically connect to each metal belt. Some of the metal belts can be connected to the ground plane for the apparatus of the invention.

The second type of the single metal sheet structure includes a heat slug, an antenna, at least a connection metal sheet and an antenna feed metal sheet. The heat slug is placed above and kept a distance from the chips. The lower portion of the heat slug includes a plurality of support elements, which electrically connect to each metal belt, and then to the ground plane. The antenna is placed above and kept a distance from the heat slug. The connection metal sheet is for connecting the antenna and the heat slug. One end of the antenna feed metal sheet is connected to the antenna, and the other end is connected to the antenna signal transmission line.

In the double metal sheet structure, each of the metal sheets is made by cutting a single metal sheet or molding into a specific shape, and then bending the metal sheet. One of the double metal sheets includes a heat slug and a plurality of support elements. The heat slug is placed above and kept a distance from the chips. The support elements electrically connect to each metal belt, which connects to the ground. In addition, the other sheet of the double metal sheets includes an antenna and an antenna feed metal sheet. The antenna is placed above and kept a distance from the heat slug. One end of the antenna feed metal sheet is connected to the antenna, and the other end is connected to the antenna signal transmission line. The heat slug and the plurality of support elements are covered by a layer of mold compound. The antenna is above the mold compound and the antenna feed metal sheet feeds the signal from the side.

The fabricating process for the antenna with the heat slug according to the invention includes the following steps: (a) providing a substrate having at least a die attached and wire bonded, and forming an antenna signal transmission line and a plurality of metal sheets, (b) placing an antenna and a heat slug on the upper surface of the substrate and filling a mold compound, and (c) placing a plurality of metal solder balls beneath the lower surface of the substrate.

According to the present invention, the structure of the antenna can be either a single metal or double metal sheets. Therefore, the step (b) in the aforementioned process can vary slightly. In the structure of single metal sheet, the metal sheet includes a plurality of support elements, and step (b) further includes the following steps: (1) cutting or molding a single metal sheet into a specific shape, (2) bending the metal sheet, (3) placing the metal sheet above the chips, connecting the antenna feed metal sheet and antenna signal transmission line, and connecting each support element and each metal belt, and (4) filling and molding a compound to cover the chips, antenna signal transmission line and a plurality of metal belts.

On the other hand, in the structure of double metal sheet, one of the metal sheets includes a heat slug and a plurality of support elements, and the other sheet includes an antenna and an antenna feed metal sheet. Step (b) further includes the following steps: (1) cutting or molding the metal sheets into a specific shape, respectively, (2) bending the metal sheets so that there is a 90° angle between the sheet containing the antenna and the antenna feed metal sheet and the sheet containing the heat slug and the support elements, (3) placing the heat slug above the chips and connecting each support element and each metal belt, (4) filling and molding a compound to cover the heat slug, the metal belts and the chips, and (5) placing the antenna above the mold compound and connecting the antenna feed metal sheet and the antenna signal transmission line.

The antenna with the heat slug of the present invention can be fabricated by simply cutting and bending a single sheet or double metal sheets. The simplicity of the fabrication lowers the overall cost. In addition, the invention fabricated by a single sheet is formed by a monolithic unit. Therefore, installing the antenna and the heat slug can be performed within a single step because the antenna and the heat slug are combined in a single sheet. Therefore, no additional step is required for the installation.

The foregoing and other objects, features, aspects and advantages of the present invention will become better understood from a careful reading of a detailed description provided herein below with appropriate reference to the accompanying drawings.

DETAILED DESCRIPTION OF THE PREFERRED EMBODIMENTS

Figure 2:
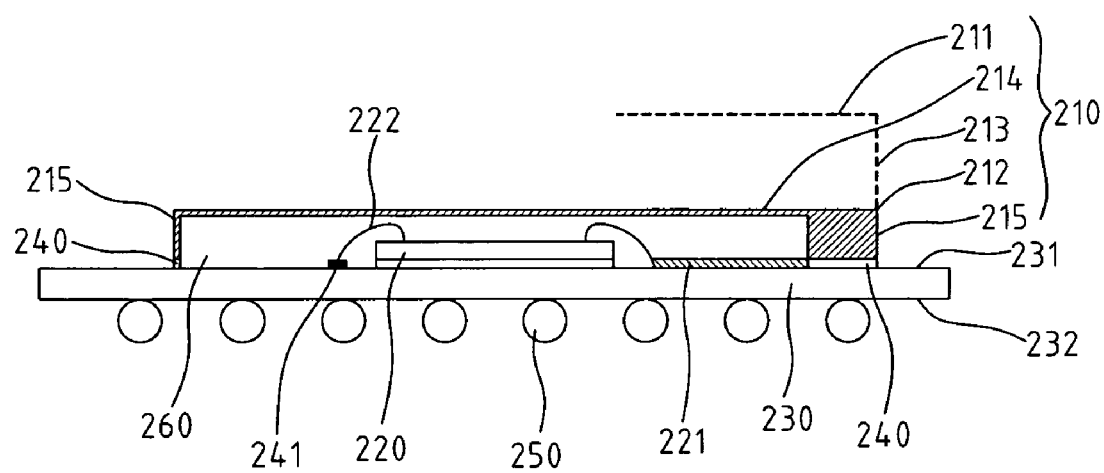
FIG. 2 shows a cross-sectional view of the antenna with heat slug according to the present invention, in which the antenna with heat slug is realized with a single metal sheet.

FIG. 2 shows a schematic view of the apparatus of antenna with heat slug according to the present invention, wherein the apparatus is with the structure of single metal sheet. Referring to FIG. 2, the apparatus includes at least a chip 220, an antenna signal transmission line 221, a plurality of metal belts 240, an antenna with heat slug unit 210, a mold compound 260 and a substrate 230. Chip 220 is placed on an upper surface 231 of substrate 230, and is connected to antenna signal transmission line 221 and bonding pad 241 by wire 222. Antenna signal transmission line 221 and metal belts 240 are formed on upper surface 231 of substrate 230. Sealing body 260 covers chip 220, antenna signal transmission line 221 and metal belts 240. Antenna with heat slug unit 210 further includes an antenna feed metal sheet 212, an antenna 211, a heat slug 214 and a plurality of support elements 215 (i.e. the structure of single metal sheet 213 with the dashed line). Heat slug 214 with its plurality of support elements 215 is a single monolithic module having the structure of single metal sheet. If the functions of antenna feed metal sheet 212 and antenna 211 are also included into the monolithic structure of heat slug 214 with its plurality of support elements 215, antenna with heat slug unit 210 becomes a structure of single metal sheet without the dashed line, as shown in FIG. 2. Antenna with heat slug unit 210 is placed above chip 220 and is connected to metal belts 240 through support elements 215. In addition, one end of antenna feed metal sheet 212 is connected to the antenna, and the other end is connected to antenna signal transmission line 221 on upper surface 231 of the substrate 230. Antenna signal transmission line 221 is also connected to chip 220. Chip 220 is connected to the external circuit through solder balls 250 beneath the lower surface 232 of substrate 230.

It is worth noticing that antenna signal transmission line 221 and metal belts 240 appear to be overlapping in FIG. 2 because of the viewing angle, although they are not actually connected.

The following description includes three embodiments of the present invention. The first and the second embodiments are both with the structure of single metal sheet, and the third embodiment is with the structure of double metal sheet.

Figure 3A:
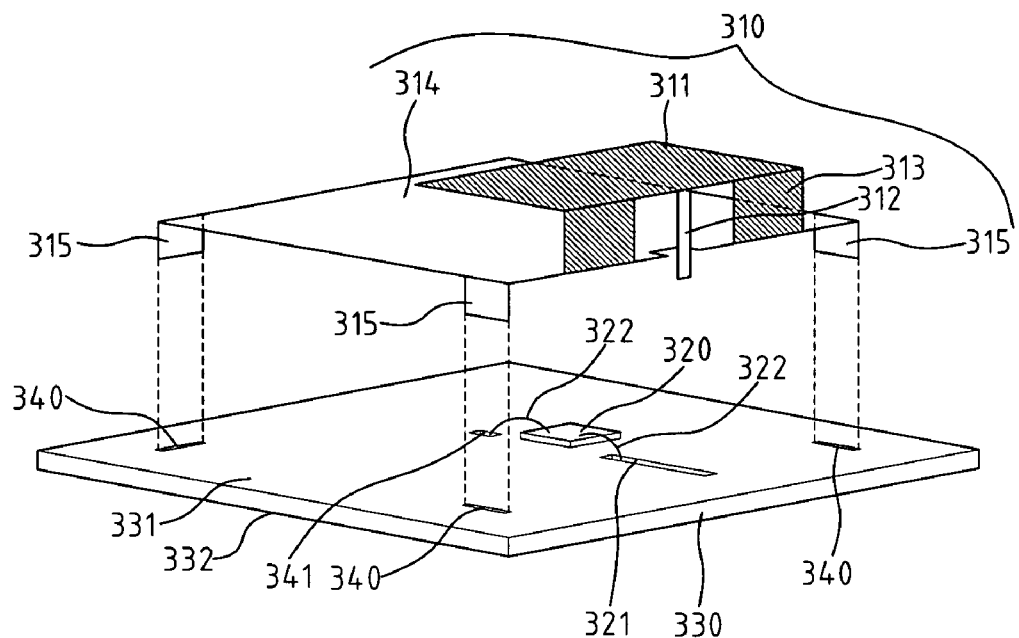
FIG. 3A shows a perspective view of the first embodiment according to the present invention.

FIG. 3A shows a perspective view of a first embodiment of the present invention. In this embodiment, the antenna with heat slug includes an antenna 311, an antenna feed metal sheet 312, at least a connection metal sheet 313, a heat slug 314, at least a chip 320, an antenna signal transmission line 321, a plurality of metal belts 340, a mold compound (described and shown in FIG. 3B) and a substrate 330. Antenna 311, antenna feed metal sheet 312, at least a connection metal sheet 313, heat slug 314 and support elements 315 constitute an antenna with heat slug module 310, which has a single metal sheet structure.

Substrate 330 has an upper surface 331 and a lower surface 332. Antenna signal transmission line 321 and a plurality of metal belts are formed on upper surface 331, where a chip 320 is attached. Chip 320 is connected to antenna signal transmission line 321 and bump pad 341 through metal wire 322. One end of connect metal sheet 313 is connected to antenna 311, and the other end is connected to heat slug 314. The angle between connection metal sheet 313 and antenna 311 is about 90°. The angle between connection metal sheet 313 and heat slug 314 is also about 90°. Therefore, antenna 311 and heat slug 314 are parallel to each other. One end of antenna feed metal sheet 312 is connected to antenna 311, with a 90° angle between them. The other end of antenna feed metal sheet 312 is connected to antenna signal transmission line 321 to transmit the antenna signal from upper surface 331 of the substrate 330 to antenna 311 in order to excite antenna 311.

Furthermore, heat slug 314 has a plurality of support elements 315 for connecting to metal belts 340 and for separating heat slug 314 from chip 320 to avoid direct contact between the two. Metal belts 340 are connected to the ground plane of the electronic device.

Figure 3B:
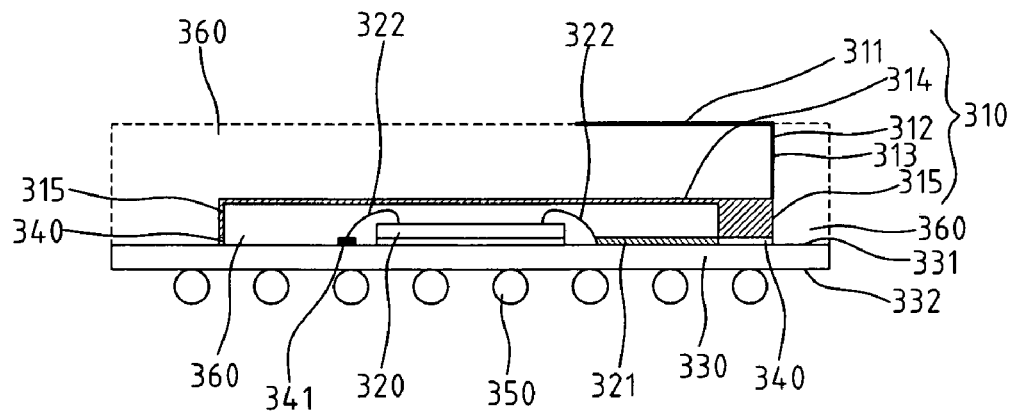
FIG. 3B shows a cross-sectional view of a first embodiment according to the present invention.

FIG. 3B is a cross-sectional view of the first embodiment of the present invention. Mold compound 360 is made of such as epoxy resin, to encompass at least chip 320, part of antenna signal transmission line 321, and metal belts 340. Mold compound 360 can also encompass the lower side of antenna 311, antenna feed metal sheet 312, and the outer side of support element 315 to protect chip 320 from erosion and oxidation.

A plurality of solder balls 350 are beneath the lower surface 332 of the substrate 330. Solder balls 350 are for connecting to the external circuit, motherboard or other electronic devices. In addition to dissipating the heat, heat slug 314 can also be applied to insulate chip 320 from the interference of the antenna radiation signal.

Figure 3C:
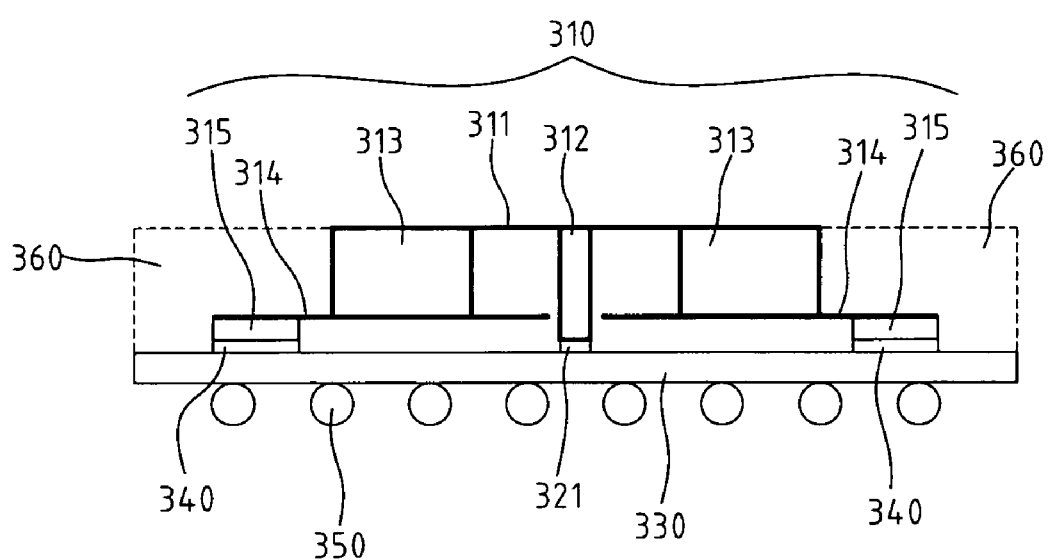
FIG. 3C is a side view of a first embodiment according to the present invention.

FIG. 3C is a side view of a first embodiment according to the present invention. Connection metal sheet 313 is connected to antenna 311 and heat slug 314, and heat slug 314 is connected to support element 315. In addition, antenna 311 is connected to antenna feed metal sheet 312. Therefore, the aforementioned components can all be combined into a monolithic structure by cutting and bending a single metal sheet.

FIGS. 4A–4E show the fabricating process of the first embodiment according to the present invention.

Figure 4A:
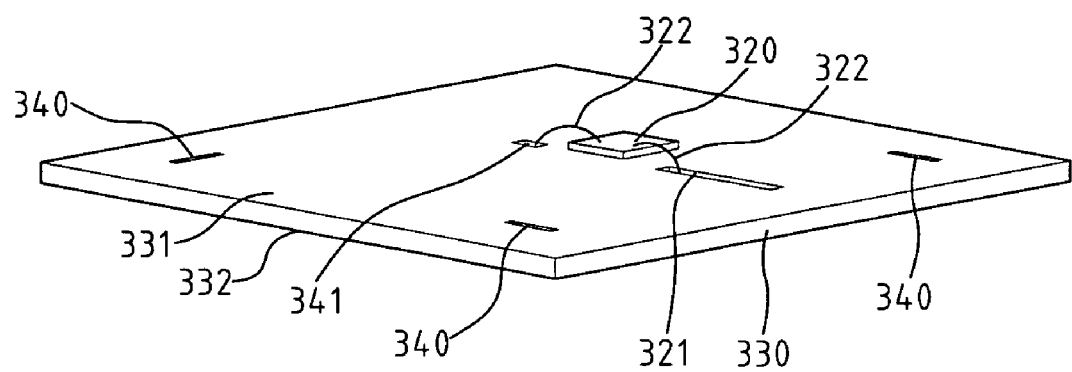
FIGS. 4A–4E show the fabricating process of the first embodiment according to the present invention.
Figure 4B:
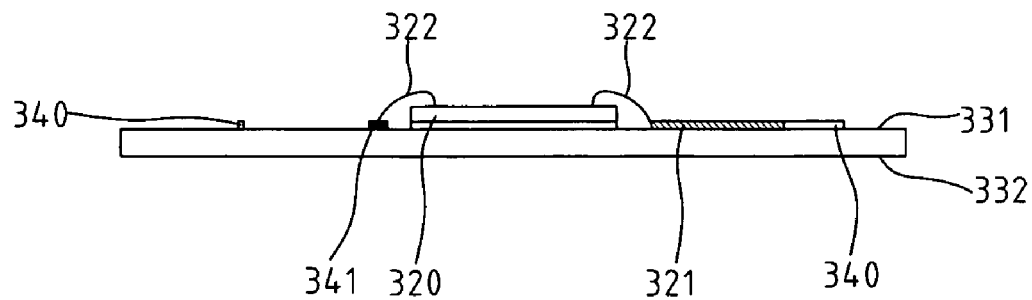

First, at least a chip 320 is attached to upper surface 331 of substrate 330, on which antenna signal transmission line 321 and a plurality of metal belts 340 are already formed. Metal wire 322 is then formed to bond chip 320. As shown in FIGS. 4A and 4B, an epoxy dispenser is applied to attach the chip 320 to substrate 330, which has bump pad 341, antenna signal transmission line 321 and a plurality of metal belts 340 thereon.

Figure 4C:
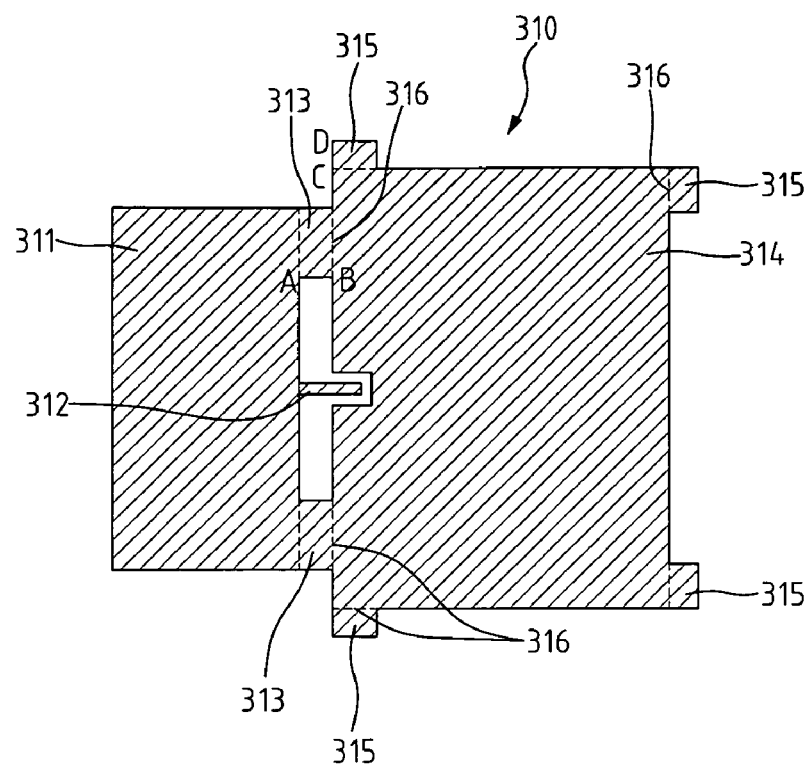

Then, a single metal sheet is cut or molded into a specific shape. Connection metal sheet 313, antenna 311, heat slug 314 and its plurality of support elements 315 are all combined in a monolithic structure. FIG. 4C is a view of an unfolded metal sheet of an antenna with heat slug 310. The length of antenna feed metal sheet 312 equals to the sum of the length $\overline{AB}$ of connection metal sheet 313 and the width $\overline{CD}$ of support element 315, so that antenna feed metal sheet 312 is easily connected to antenna signal transmission line 321. Because the present invention is monolithic, the fabricating cost can be reduced.

Figure 4D:
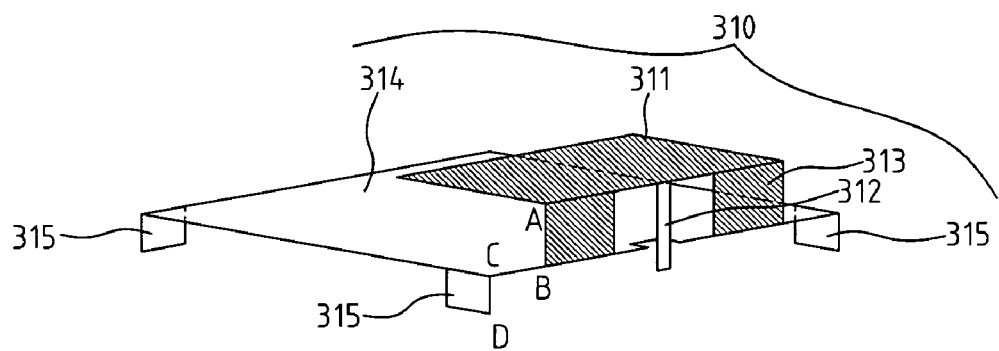

The single metal sheet is then bended so that heat slug 314 and support elements 315, connection metal sheet 313 and heat slug 314, and connection metal sheet and antenna 311 are all perpendicular to each other. FIG. 4D shows the shape of the single metal sheet after bending along the dashed line.

The next step is to mount the single metal sheet to upper surface 331 of the substrate 330, to connect antenna feed metal sheet 312 to antenna signal transmission line 321, and each support element 315 to each metal belt 340; and to form mold compound 360. During the mounting, no extra antenna feed circuit is required as antenna feed metal sheet 312 is in direct contact with antenna signal transmission line 321. Mold compound 360 at least encompasses chip 320, antenna signal transmission line 321, and metal belt 340. Mold compound 360 may also encompass the lower side of antenna 311, antenna feed metal sheet 312, and the outer side of support element 315 for holding the module in place.

Figure 4E:
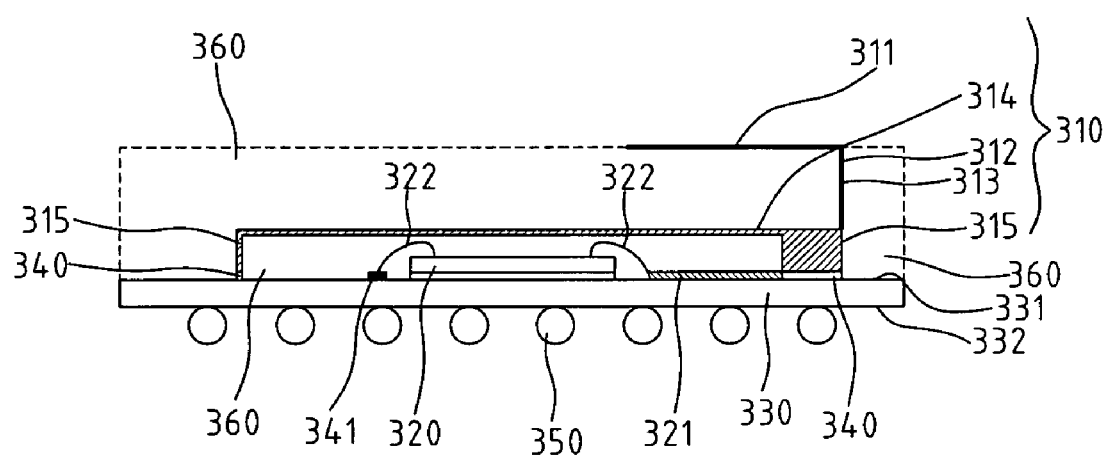

Finally, a plurality of solder balls 350 are bonded beneath the lower surface 332 of the substrate 330 for connecting to the external circuits, as shown in FIG. 4E.

It is worth noticing that antenna signal transmission line 321 and metal belts 340 appear to be overlapping in FIGS. 3B, 4B and 4E. However, as shown in FIGS. 3A and 4A, they are actually not connected at all.

The aforementioned process shows that the steps of the packaging process are identical to the steps in a conventional packaging process shown in FIG. 1. The only difference is to replace the conventional heat slug with the heat slug of the present invention. Therefore, the present invention does not require a new fabricating process, and meets the objects of high integration and low manufacturing cost.

Figure 5:
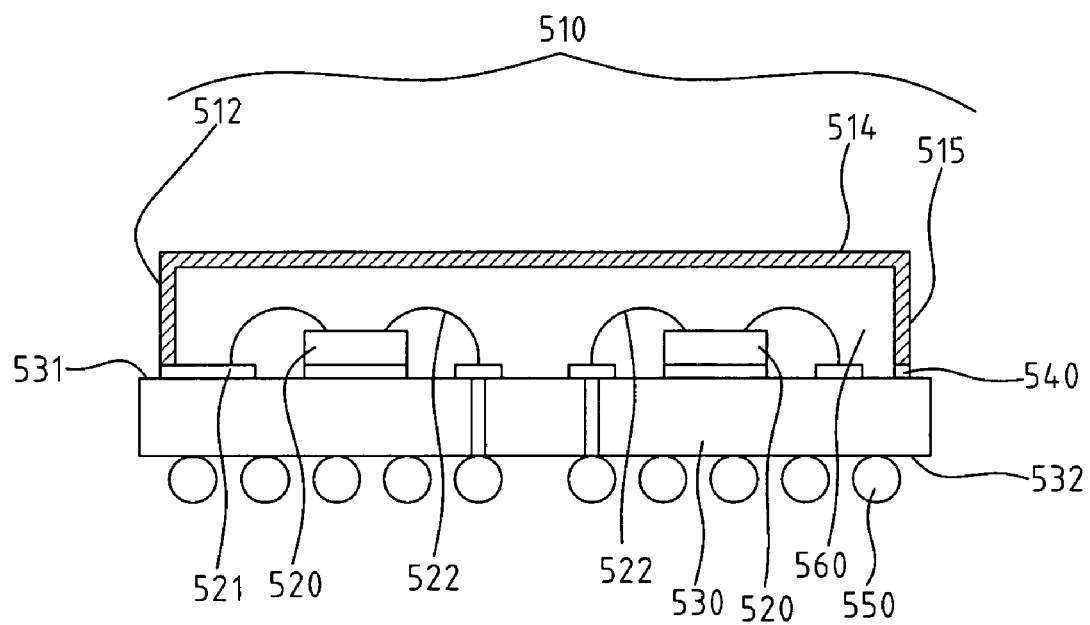
FIG. 5 is a cross-sectional view of a second embodiment according to the present invention.

FIG. 5 shows a side view of a second embodiment of the present invention. An antenna with heat slug module 510 has a structure similar to that of the first embodiment. Antenna with heat slug module 510 includes a heat slug 514, which can dissipate heat as well as act as an antenna. Heat slug 514 has a plurality of support elements 515, which is also formed in a monolithic structure. One of the plurality of support elements is an antenna feed metal sheet 512 connected to antenna signal transmission line 521 on upper surface 531 of the substrate 530. The remaining support elements 513 are connected to metal belts 540, respectively. Some of the metal belts 540 are connected to the ground plane.

FIGS. 6A–6E show the fabricating process of the second embodiment according to the present invention.

Figure 6A:
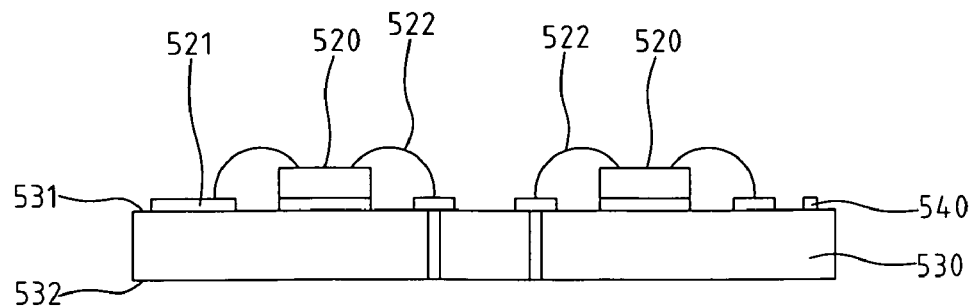
FIGS. 6A–6E show the fabricating process of the second embodiment according to the present invention.

The second embodiment has a fabricating process similar to that of the first embodiment. The difference is that the single metal sheet is cut or molded into a different shape in the process. First, as shown in FIG. 6A, at least a chip 520 is attached to upper surface 531 of substrate 530, on which antenna signal transmission line 521 and a plurality of metal belts 540 are already formed. Wire bond 522 is then formed to connect chip 320.

Figure 6B:
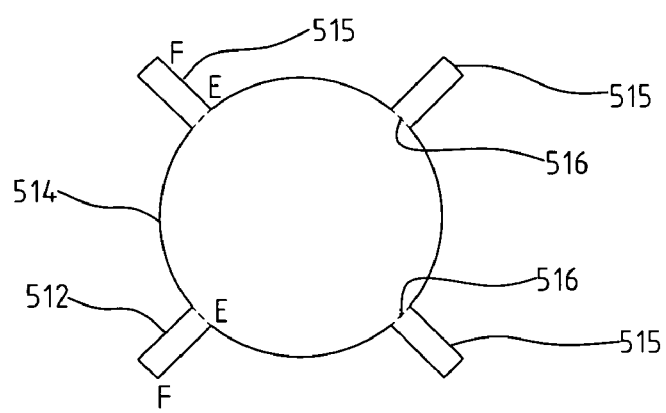
Figure 6C:
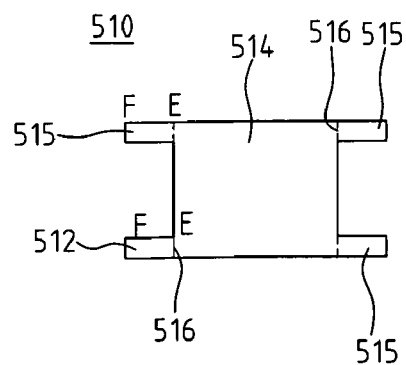
Figure 6D:
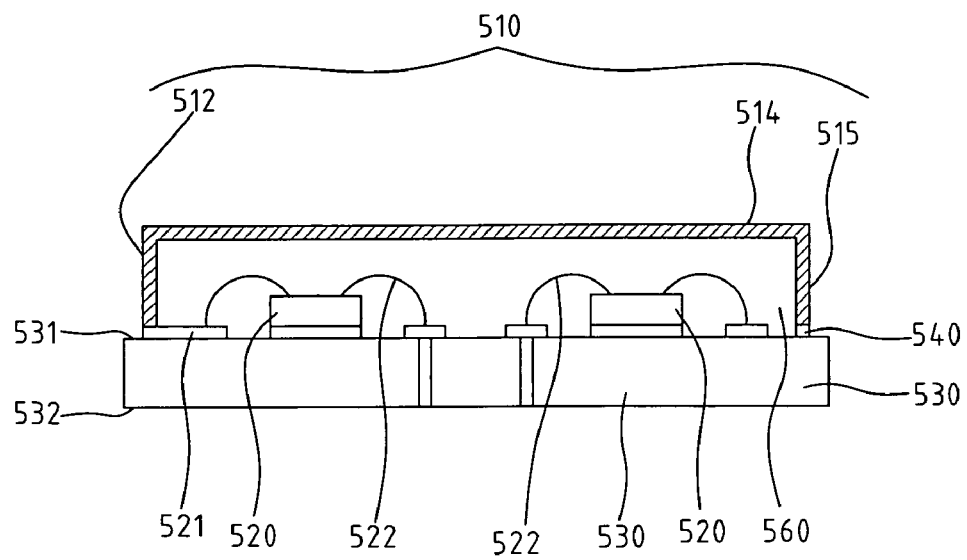

Then, a single metal sheet is cut or molded into a specific shape. As shown in FIGS. 6B and 6C, heat slug 514 can be either of the round shape or a rectangular shape, and antenna feed metal sheet 512 can be one of the support elements. In the following bending step, the single metal sheet is bended along dashed line 516, as shown in FIGS. 6B and 6C, to make heat slug 514 being perpendicular to support elements 515.

The next step is to mount the single metal sheet to upper surface 531 of the substrate 530, to connect antenna feed metal sheet 512 to antenna signal transmission line 521, and each support element 515 to each metal belt 540, and to form mold compound 560. The height of antenna feed metal sheet 512 is the length of $\overline{EF}$ in FIGS. 6B and 6C.

Figure 6E:
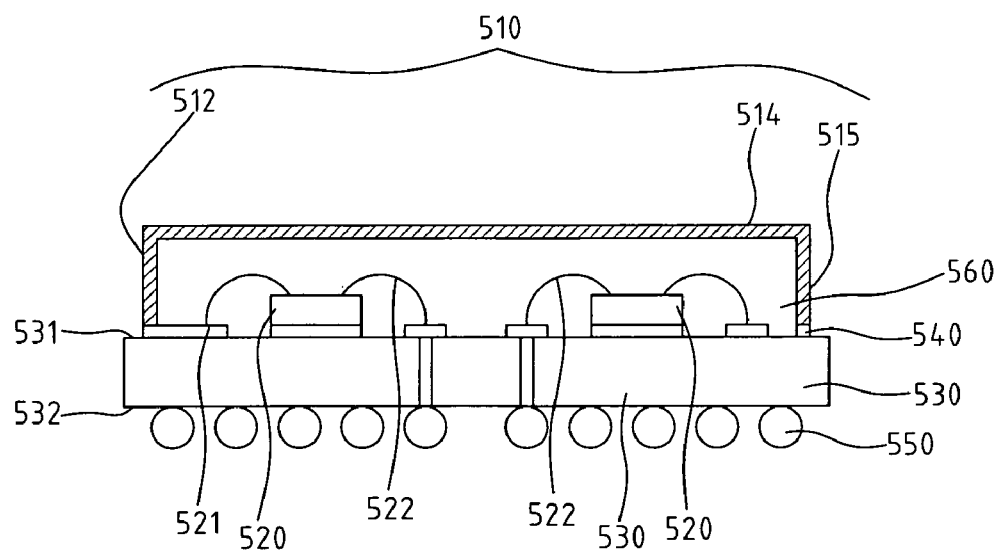

Finally, a plurality of solder balls 550 are placed on lower surface 532 of the substrate 530 for connecting to the external circuits, as shown in FIG. 6E.

Figure 7:
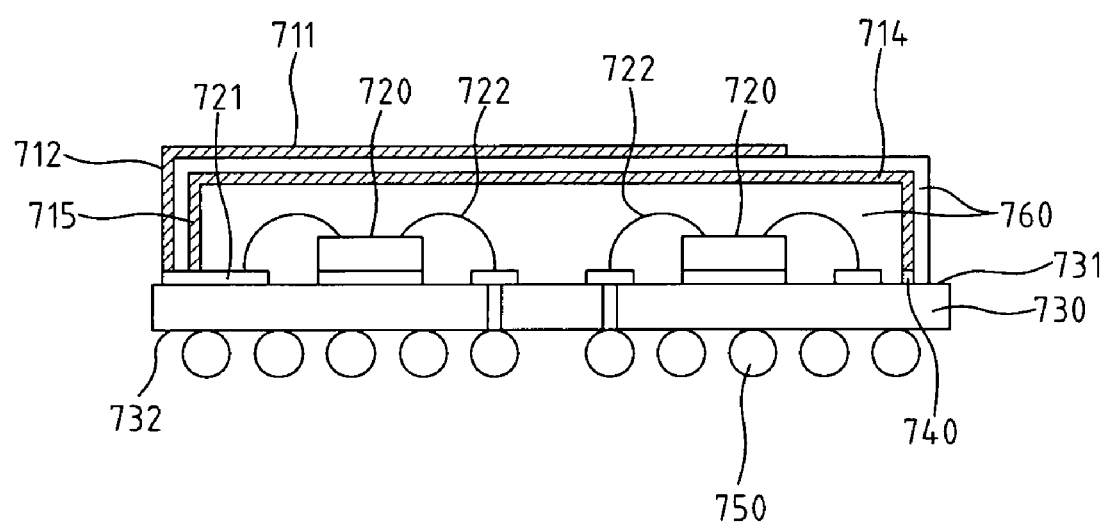
FIG. 7 shows a cross-sectional view of a third embodiment according to the present invention.

FIG. 7 shows a side view of a third embodiment of the present invention. The third embodiment is similar to the first embodiment of the present invention except that the structure of the antenna with heat slug is double metal sheet. In other words, antenna 711 and antenna feed metal sheet 712 are made of a metal sheet, while heat slug 714 and its plurality of support elements 715 are made of another metal sheet. Support elements 715 of heat slug 714 are for connecting to metal belts 740 and separating heat slug 714 from chip 720 to avoid direct contact. Mold compound 760 at least encompasses the upper side of heat slug 714 and the outer side of support elements 715. Antenna 711 is mounted above sealing body 760. Mold compound 760 also acts as a substrate between antenna 711 and heat slug 714. On the other hand, one end of antenna feed metal sheet 712 is connected to antenna 711 forming a 90° angle, and the other end is connected to antenna signal transmission line 721 so that the antenna signal is fed from antenna feed metal sheet 712 on the side.

It is worth noticing that antenna signal transmission line 721 and support elements 715 appear to be overlapping in FIGS. 8D–8G. However, they are actually not connected at all.

FIGS. 8A–8G show the fabricating process of the third embodiment of the present invention.

Figure 8A:
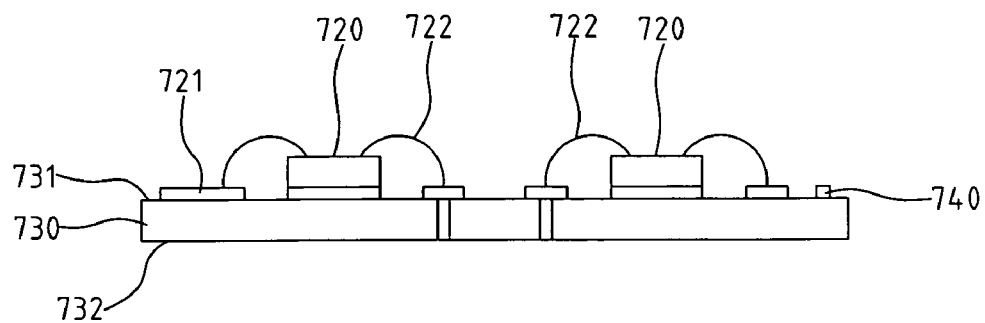
FIGS. 8A–8G show the fabricating process of the third embodiment according to the present invention.

First, at least a chip 720 is attached to upper surface 731 of substrate 730, on which antenna signal transmission line 721 and a plurality of metal belts 740 are already formed. Wire bond 722 is then formed to connect chip 320, as shown in FIG. 8A.

Figure 1A:
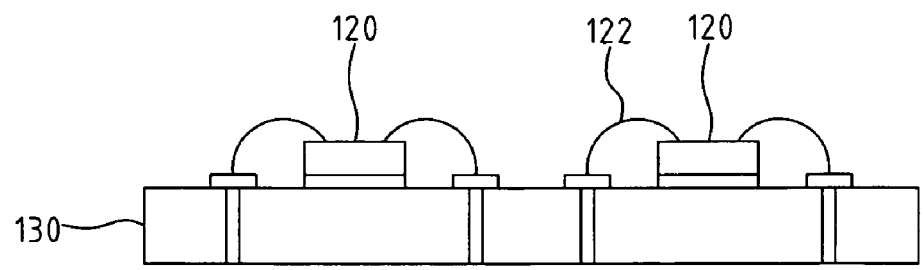
FIG. 1A is a side view of a conventional multi-chip-module after the steps of die attach and wire bond.
Figure 1B:
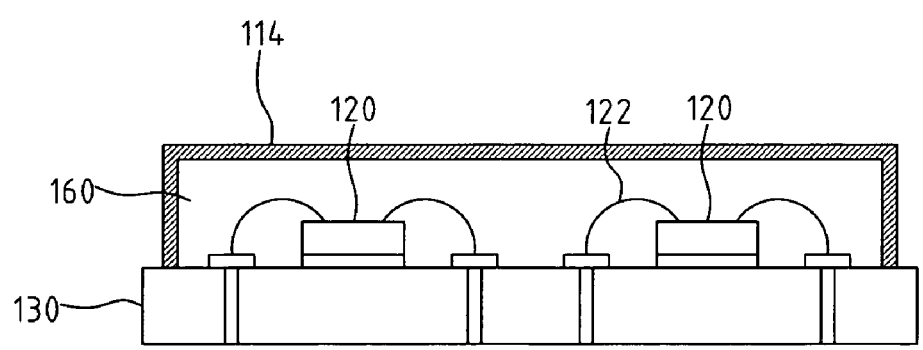
FIG. 1B is a side view of a multi-chip-module after the steps of heat slug attach and compound molding.
Figure 1C:
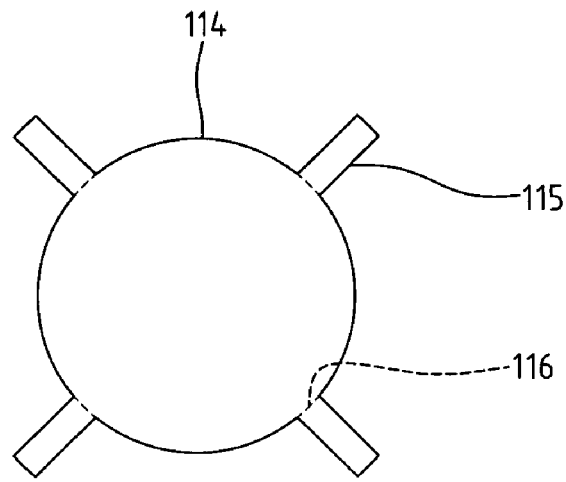
FIG. 1C shows an expanded view of a conventional heat slug.
Figure 1D:
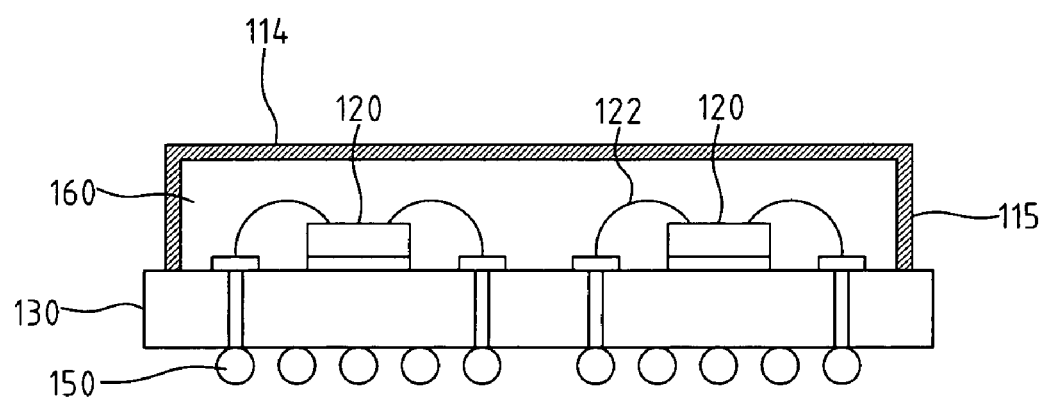
FIG. 1D shows a side view of a conventional multi-chip module after ball placement.

Then, the metal sheets are cut or molded into a specific shape, respectively. Because the structure of this embodiment uses double metal sheets, each of the metal sheets must be cut or molded into a different shape in accordance with the design. As the example shown in FIGS. 8B and 8C, antenna 711 has a rectangular or round shape, while antenna feed metal sheet 712 may have a triangular or rectangular shape. As for heat slug 714 and its plurality of support elements 715, the metal sheet can be cut or molded into a shape as shown in FIG. 1C.

Figure 8B:
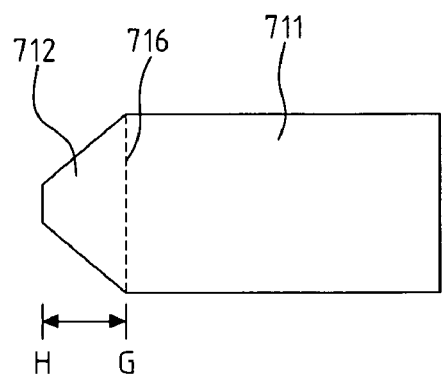
Figure 8C:
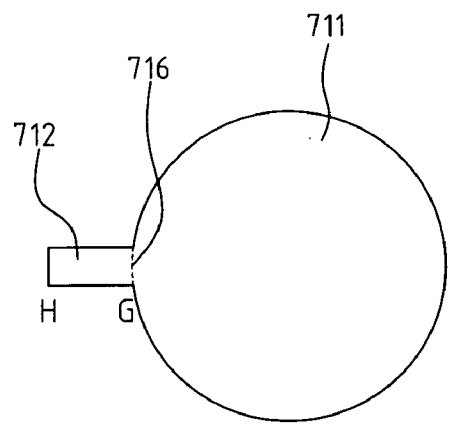

The metal sheets are then bended so that heat slug 714 and support elements 715, and connection metal sheet 712 and antenna 711 are all perpendicular to each other. FIGS. 8B, 8C and iC show the shape of the metal sheets after bending along the dashed lines 716, 116.

Figure 8D:
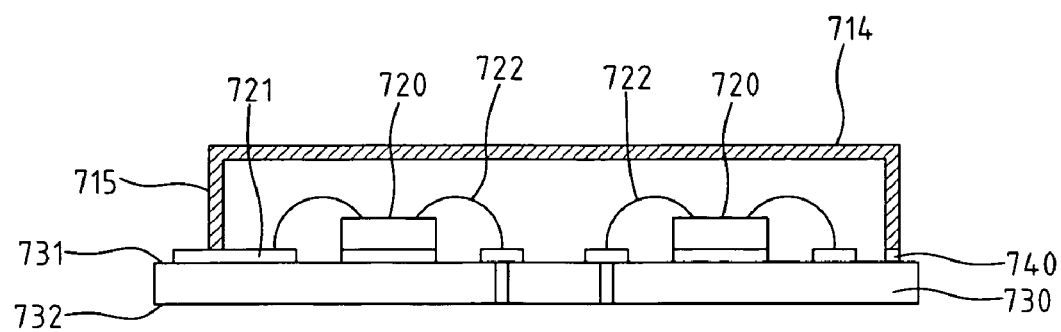
Figure 8E:
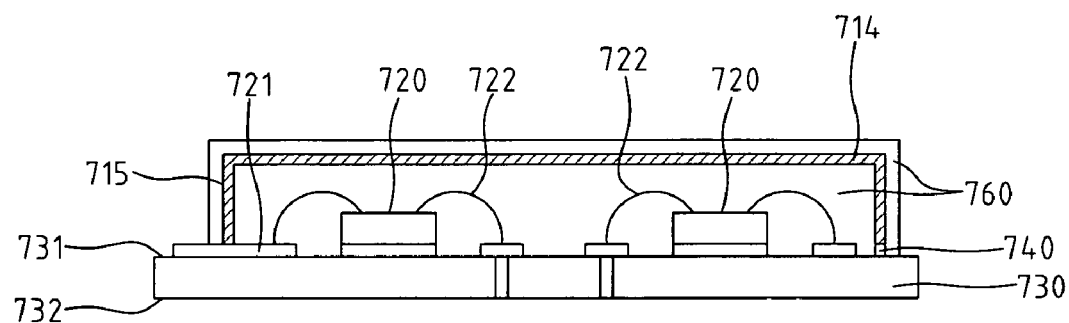

The next step is to mount heat slug 714 to upper surface 731 of the substrate 730, and to connect each support element 715 to each metal belt 740, as shown in FIG. 8D. Then, mold compound 760 is formed to encompass at least chip 720, a part of antenna signal transmission line 721, metal belts 740, the upper side of heat slug 714 and the outer side of support elements 715, as shown in FIG. 8E.

Figure 8F:
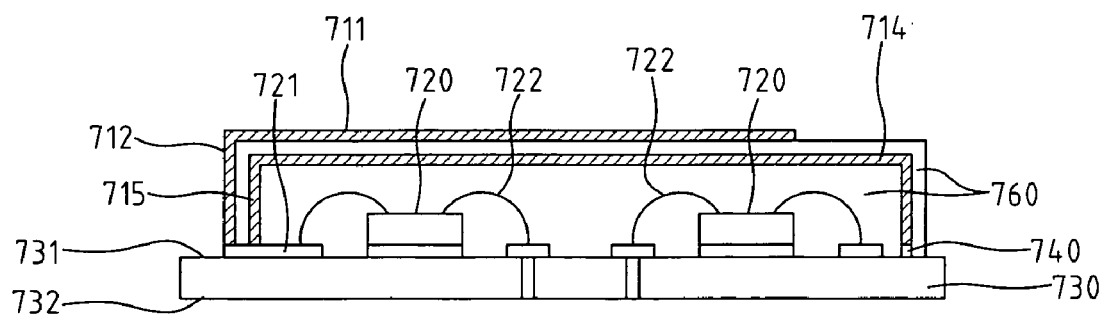

Then, antenna 711 is placed above sealing body 760 and antenna feed metal sheet 712 is connected to antenna signal transmission line 721, as shown in FIG. 8F. The height of antenna feed metal sheet 712 is the length $\overline{GH}$ of in FIGS. 8B and 8C.

Figure 8G:
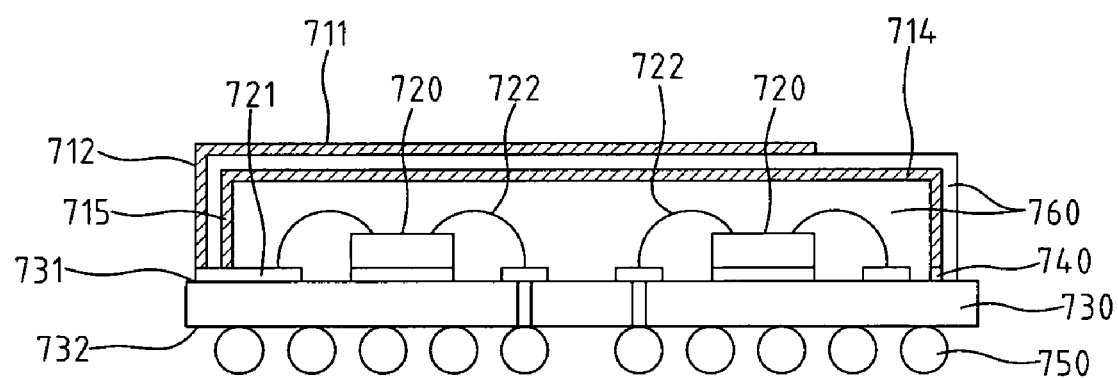

Finally, a plurality of solder balls 750 are placed on lower surface 732 of the substrate 730 for connection to the external circuits, as shown in FIG. 8G.

In summary, the antenna with heat slug of the present invention, with the structure of using a single metal sheet or double metal sheets, is simple in structure and easy to fabricate. In particular, the structure of single metal sheet takes advantage of a monolithic structure of the antenna with heat slug so that the antenna and the heat slug are simultaneously mounted and sealed inside a package. The process is identical to the conventional packaging process. Therefore, no new process is required. The present invention reduces the manufacturing cost and meets the high integration object.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An apparatus of antenna with heat slug, comprising:
    a substrate having an upper surface and a lower surface, said lower surface having a plurality of solder balls for electrically connecting to an external circuit;
    an antenna signal transmission line formed on said upper surface of said substrate;
    at least a chip attached on said upper surface of said substrate and electrically connecting to said antenna signal transmission line;
    at least a metal belt formed on said upper surface of said substrate;
    at least a metal sheet having functions of an antenna and heat dissipation, placed on said upper surface of said substrate; and
    a mold compound encompassing at least said chip, said antenna signal transmission line and each said metal belt.

2. The apparatus as claimed in claim 1, wherein said at least a metal sheet is a single metal sheet, said single metal sheet is made by cutting or molding the metal sheet into a specific shape and then bending said metal sheet, said single metal sheet comprising:
    a heat slug having an antenna, placed above said chip and kept a distance from said chip; and
    a plurality of support elements, one of said support elements being an antenna feed metal sheet for electrically connecting to said antenna signal transmission line, and the remaining support elements electrically connecting to each said metal belt.

3. The apparatus as claimed in claim 2, wherein the shape of said heat slug having an antenna is either round or rectangular.

4. The apparatus as claimed in claim 2, wherein said heat slug with an antenna and said support elements are perpendicular.

5. The apparatus as claimed in claim 2, wherein said heat slug with an antenna and said substrate are parallel.

6. The apparatus as claimed in claim 1, wherein said at least a metal sheet is a single metal sheet, said single metal sheet is made by cutting or molding the metal sheet into a specific shape and then bending said metal sheet, said single metal sheet comprising:
 a heat slug placed above said chip and kept a distance from said chip, said heat slug having a plurality of support elements underneath, said heat slug using said support elements to electrically connect to each said metal belt which connects to a ground plane;
 an antenna placed above said heat slug and kept a distance from said heat slug;
 at least a connection metal sheet connecting said antenna and said heat slug; and
 an antenna feed metal sheet having one end connecting to said antenna and the other end connecting to said antenna signal transmission line.

7. The apparatus as claimed in claim 6, wherein said connection metal sheet and said heat slug, said connection metal sheet and said antenna are both perpendicular.

8. The apparatus as claimed in claim 6, wherein a sealing body encompasses a lower side of said antenna, an upper side of said heat slug, and outer sides of said support elements and said connection metal sheet.

9. The apparatus as claimed in claim 6, wherein said heat slug and said support elements are perpendicular.

10. The apparatus as claimed in claim 6, wherein said heat slug and said antenna are parallel and extend to a same direction.

11. The apparatus as claimed in claim 6, wherein said heat slug and said substrate are parallel.

12. The apparatus as claimed in claim 6, wherein said antenna feed metal sheet and said antenna are perpendicular.

13. The apparatus as claimed in claim 1, wherein said at least a metal sheet further comprises a first metal sheet and a second metal sheet, said first and second metal sheets are made by cutting or molding said metal sheets into a specific shape and then bending said metal sheets respectively, said first metal sheet further comprising:
 a heat slug, placed above said chip and kept a distance from said chip; and
 a plurality of support elements electrically connecting to each said metal belt which connects to a ground plane;
 said second metal sheet further comprising:
 an antenna placed above said heat slug and kept a distance from said heat slug; and
 an antenna feed metal sheet having one end connecting to said antenna and the other end connecting said antenna signal transmission line;
 wherein said mold compound encompasses an upper side of said heat slug and outer sides of said support elements, said antenna is placed above said mold compound and said antenna feed metal sheet feeds said antenna from a side.

14. The apparatus as claimed in claim 13, wherein the shape of said antenna is either round or rectangular.

15. The apparatus as claimed in claim 13, wherein the shape of said antenna feed metal sheet is either triangular or rectangular.

16. The apparatus as claimed in claim 13, wherein said heat slug and said support elements are perpendicular.

17. The apparatus as claimed in claim 13, wherein said heat slug and said antenna are parallel and extend to the same direction.

18. The apparatus as claimed in claim 13, wherein said heat slug and said substrate are parallel.

19. The apparatus as claimed in claim 13, wherein said antenna feed metal sheet and said antenna are perpendicular.

20. A process of fabricating an antenna with heat slug, comprising the following steps of:
 (a) providing a substrate, on an upper surface of said substrate, an antenna signal transmission line and a plurality of metal belts being formed, and at least a chip being attached and wire bonded;
 (b) placing an antenna and a heat slug on said upper surface of said substrate and applying a mold compound; and
 (c) placing a plurality of solder balls on a lower surface of said substrate.

21. The process as claimed in claim 20, wherein said antenna and said heat slug are made of a single metal sheet, said single metal sheet has a plurality of support elements, and said step (b) further comprises the following steps:
 cutting or molding said single metal sheet into a specific shape;
 bending said single metal sheet;
 placing said single metal sheet above said chip, connecting an antenna feed metal sheet to said antenna signal transmission line, and connecting each of said support elements to each of said metal belts; and
 applying said mold compound to encompass said chip, said antenna signal transmission line and said metal belts.

22. The process as claimed in claim 21, wherein said heat slug with said antenna is further formed by said single metal sheet, and said antenna feed metal sheet is formed by one of said support elements.

23. The process as claimed in claim 21, wherein said antenna feed metal sheet is further formed by said single metal sheet.

24. The process as claimed in claim 20, wherein said antenna and said heat slug are made of a first metal sheet and a second metal sheet, said first metal sheet has said heat slug and a plurality of support elements, said second metal sheet has said antenna and an antenna feed metal sheet, and said step (b) further comprises the following steps:
 cutting or molding said first and second metal sheets into a specific shape, respectively;
 bending said first and second metal sheets so that said antenna and said antenna feed metal sheet are perpendicular, and said heat slug and said support elements are perpendicular;
 placing said heat slug above said at least a chip, and connecting each of said support elements to each of said metal belts;
 applying said mold compound on an upper side of sad heat slug and outer sides of said support elements to encompass said chip, said antenna signal transmission line and said metal belts; and
 placing said antenna above said mold compound and connecting said antenna feed metal sheet to said antenna signal transmission line.

* * * * *